United States Patent
Perry et al.

(10) Patent No.: US 8,350,984 B2
(45) Date of Patent: *Jan. 8, 2013

(54) DISPLAY ENCLOSURE

(75) Inventors: Michael C. Perry, Roselle, IL (US);
Jerry Moscovitch, Toronto (CA);
Luther V. Diaz Yap, Toronto (CA);
Raymond Wilk, Toronto (CA)

(73) Assignee: Ciil Technologies, Inc., Melrose Park, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/331,597

(22) Filed: Dec. 20, 2011
(Under 37 CFR 1.47)

(65) Prior Publication Data

US 2012/0092818 A1    Apr. 19, 2012

Related U.S. Application Data

(63) Continuation of application No. 12/949,349, filed on Nov. 18, 2010, now Pat. No. 8,102,483, which is a continuation-in-part of application No. 12/719,185, filed on Mar. 8, 2010, now Pat. No. 8,081,267.

(51) Int. Cl.
*G02F 1/1333* (2006.01)

(52) U.S. Cl. ............... 349/58; 349/56; 349/59; 349/60; 349/72

(58) Field of Classification Search .............. 349/56, 349/58, 59, 60, 72
See application file for complete search history.

(56) References Cited

U.S. PATENT DOCUMENTS

| | | |
|---|---|---|
| 3,004,815 A | 10/1961 | O'Kain et al. |
| 4,771,299 A | 9/1988 | Gell, Jr. |
| 5,045,971 A | 9/1991 | Ono et al. |
| 5,071,203 A | 12/1991 | Boyd |
| 5,160,357 A | 11/1992 | Faber |
| 5,335,076 A | 8/1994 | Reh et al. |
| D356,548 S | 3/1995 | Bottcher et al. |
| 5,410,373 A | 4/1995 | Sagues et al. |
| 5,420,828 A | 5/1995 | Geiger |
| 5,748,269 A | 5/1998 | Harris et al. |
| 5,850,333 A | 12/1998 | Owanesian et al. |
| 5,869,919 A | 2/1999 | Sato et al. |
| 5,970,980 A | 10/1999 | Adair |

(Continued)

FOREIGN PATENT DOCUMENTS

EP    1 933 555 A1    6/2008

(Continued)

OTHER PUBLICATIONS

Alibaba.com products, http://alibaba.com/showroom/led_display_led_screen_stadium_let_display.html, May 17, 2010, 9 pages.

(Continued)

*Primary Examiner* — Jennifer Doan
(74) *Attorney, Agent, or Firm* — Foley & Lardner LLP

(57) ABSTRACT

A low profile display enclosure system for enclosing a display device for viewing that protects the display device from environmental effects. The substantially sealed display enclosure comprises a rigid bezel, a substantially transparent front cover coupled to the bezel, and a rear cover assembly that may include a heat sink portion. A liquid organic coating is applied to portions of the display enclosure and cured in place in order to provide a protective surface.

20 Claims, 7 Drawing Sheets

U.S. PATENT DOCUMENTS

| | | | |
|---|---|---|---|
| 5,991,153 A | 11/1999 | Heady et al. |
| 6,061,976 A | 5/2000 | Willbanks, Jr. |
| 6,068,119 A | 5/2000 | Derr et al. |
| 6,101,090 A | 8/2000 | Gates |
| 6,104,451 A | 8/2000 | Matsuoka et al. |
| 6,119,768 A | 9/2000 | Dreier et al. |
| 6,132,367 A | 10/2000 | Adair |
| 6,424,391 B1 | 7/2002 | Tsukamoto et al. |
| 6,474,410 B1 | 11/2002 | Minich et al. |
| 6,476,883 B1 | 11/2002 | Salimes et al. |
| 6,479,142 B1 | 11/2002 | Condon et al. |
| 6,480,243 B2 | 11/2002 | Yamamoto |
| 6,575,541 B1 | 6/2003 | Hendrick et al. |
| 6,646,864 B2 | 11/2003 | Richardson |
| 6,659,274 B2 | 12/2003 | Enners |
| 6,783,198 B2 | 8/2004 | Rudd et al. |
| 6,802,575 B1 | 10/2004 | Lee |
| 6,819,866 B2 | 11/2004 | Da Silva |
| 6,845,775 B1 | 1/2005 | Barthes |
| 6,871,138 B1 | 3/2005 | Minelli |
| 6,888,591 B2 | 5/2005 | Kim |
| 6,966,617 B2 | 11/2005 | Chen et al. |
| 6,968,067 B2 | 11/2005 | López |
| 6,977,666 B1 | 12/2005 | Hendrick |
| 6,977,808 B2 | 12/2005 | Lam et al. |
| 7,089,495 B2 | 8/2006 | Barrows |
| 7,110,247 B2 | 9/2006 | Kim et al. |
| D529,490 S | 10/2006 | Jackson, Jr. |
| 7,140,732 B2 | 11/2006 | Shiraishi et al. |
| 7,158,376 B2 | 1/2007 | Richardson et al. |
| 7,173,678 B2 | 2/2007 | Havelka et al. |
| 7,180,735 B2 | 2/2007 | Thomas et al. |
| D539,530 S | 4/2007 | Sanderson et al. |
| 7,206,037 B2 | 4/2007 | Nishio et al. |
| 7,212,403 B2 | 5/2007 | Rockenfeller |
| 7,214,970 B2 | 5/2007 | Andoh |
| D546,824 S | 7/2007 | Jackson, Jr. |
| 7,257,003 B2 | 8/2007 | Ono |
| 7,289,320 B2 | 10/2007 | Chang et al. |
| 7,312,984 B2 | 12/2007 | Richardson et al. |
| D561,775 S | 2/2008 | Wohlford et al. |
| 7,337,024 B1 | 2/2008 | Graham |
| 7,339,783 B2 | 3/2008 | McEwan et al. |
| 7,345,875 B2 | 3/2008 | Elkins |
| D566,661 S | 4/2008 | Ludwig et al. |
| 7,463,487 B2 | 12/2008 | Kim |
| 7,464,512 B1 | 12/2008 | Perina |
| 7,522,416 B2 | 4/2009 | Kim et al. |
| 7,529,082 B2 | 5/2009 | Maruta |
| 7,535,799 B2 | 5/2009 | Polany et al. |
| 7,679,888 B2 | 3/2010 | Kirschner et al. |
| 7,742,141 B2 | 6/2010 | Kawano |
| 7,812,891 B2 | 10/2010 | Maruta |
| D641,721 S | 7/2011 | Moscovitch et al. |
| 8,081,267 B2 | 12/2011 | Moscovitch et al. |
| 8,102,483 B2 * | 1/2012 | Perry et al. ............... 349/58 |
| 2003/0205951 A1 | 11/2003 | Lambert |
| 2004/0000390 A1 | 1/2004 | Stadjuhar, Jr. et al. |
| 2004/0012729 A1 | 1/2004 | Kim |
| 2004/0165123 A1 | 8/2004 | Iguchi et al. |
| 2006/0077314 A1 | 4/2006 | Li et al. |
| 2006/0077636 A1 | 4/2006 | Kim |
| 2006/0274493 A1 | 12/2006 | Richardson et al. |
| 2007/0139873 A1 | 6/2007 | Thomas et al. |
| 2008/0024694 A1 | 1/2008 | Kondo et al. |
| 2008/0055849 A1 | 3/2008 | Lee |
| 2008/0062626 A1 | 3/2008 | Ryman et al. |
| 2008/0093956 A1 | 4/2008 | Maxson |
| 2008/0123014 A1 | 5/2008 | Lin |
| 2008/0143918 A1 | 6/2008 | Kim |
| 2008/0218952 A1 | 9/2008 | Benn |
| 2008/0309843 A1 | 12/2008 | Matsutani et al. |
| 2009/0009945 A1 | 1/2009 | Johnson et al. |
| 2009/0184893 A1 | 7/2009 | Yang |
| 2009/0225240 A1 | 9/2009 | Suzuki et al. |
| 2009/0231807 A1 | 9/2009 | Bouissiere |
| 2009/0231808 A1 | 9/2009 | Burgner |
| 2010/0171889 A1 | 7/2010 | Pantel et al. |
| 2010/0315777 A1 | 12/2010 | Dreher |
| 2011/0075361 A1 | 3/2011 | Nakamichi et al. |
| 2011/0085301 A1 | 4/2011 | Dunn |
| 2011/0216482 A1 | 9/2011 | Moscovitch et al. |

FOREIGN PATENT DOCUMENTS

| | | | |
|---|---|---|---|
| GB | 2449877 B | 4/2010 |
| JP | 2002158475 | 5/2002 |
| KR | 2001 048363 A | 6/2001 |
| KR | 100815612 B1 | 3/2008 |
| KR | 1020080042287 A | 5/2008 |
| KR | 1020080054761 A | 6/2008 |
| KR | 100922106 B1 | 9/2009 |
| WO | WO 02/37919 A1 | 5/2002 |
| WO | WO 03/001798 A1 | 1/2003 |
| WO | WO 2009/135308 A1 | 11/2009 |
| WO | WO 2011/011704 A2 | 1/2011 |
| WO | WO 2011/059793 A2 | 5/2011 |

OTHER PUBLICATIONS

"LCD Enclosures™, Protect and Showcase Your Investments!," LCD Enclosures, http://LCDenclosures.com/products_display_enclosures.html, May 17, 2010, 3 pages.

"Waterproof TV-Legends Series Colorful Life," Luxurite UK Ltd., http://www.luxurite.com/products/waterproof-TV/waterproof-TV-legend.html, May 17, 2010, 5 pages.

"Pantel—Ultrabright Outdoor Screen TVs," http://panteltv.com, May 17, 2010, 5 pages.

"UL XT 66 Two Component Modified Polyurea Protective Coating," Ultimate Linings, www.ultimatelinings.com, Oct. 26, 2009 you and you and you and you and you and I and you and is in and you and you and you yeah and and no and you and you and you and is and is is is a ride in the cabin draft is no man I him him him him him, 3 pages.

"Reactor™ 230Vac Three Phase, Electric, Heated, Plural Component Proportioner Electrical Diagrams," Gray Co. Inc., 2003, 10 pages.

International Search Report and Written Opinion for PCT Application No. PCT/US 2010/039815, Title: Display Enclosure, Apr. 14, 2011, 8 pages.

U.S. Appl. No. 29/362,147, filed May 20, 2010, Moscovitch et al.

U.S. Appl. No. 13/354,981, filed Jan. 20, 2012, Campagna et al.

U.S. Appl. No. 29/405,002, filed Oct. 27, 2011, Seo Byung Hee.

U.S. Appl. No. 12/559,095, filed Sep. 14, 2009, Hatch et al.

"Peerless® Mounts Audio/Visual Mounting Solutions, Product Catalog," Peerless Industries, Inc., pp. 89-91, Jul. 1, 2008.

"Installation Instructions DGC Series Display Guard™ Enclosures DGC32, DGC42, DGC-50 and DGC-65," Chief Manufacturing Inc., Apr. 2007.

"Pro AV Home Entertainment, Display Guards™ Indoor/Outdoor," Chief Manufacturing, CSAV, Inc, 2007.

"Flat Panel Frames/Enclosures," Chief Manufacturing, http://www.chiefmfg.com/, 2008.

"DGC/DGCA Series DGC/DGCA Series Indoor/Outdoor Enclosures," Chief Manufacturing, http://www.chiefmfg.com/, 2008.

"Viewstation by Itsenclosures, Protecting the Products That Serve People," ITS Enclosures, http://itsenclosures.com/viewstation, 2006.

"Itsenclosures Model #—LFD573710-xx 50" viewstation LFD Data," ITS Enclosures, Standard Product Data Sheet, Mar. 15, 2005.

"Viewstation by Itsenclosures, Outdoor VS-O-LFD573710, 50" Outdoor," ITS Enclosures, http://itsenclosures.com/products, 2006.

"Viewstation by Itsenclosures, Outdoor Protect Your Message," ITS Enclosures, http://itsenclosures.com/products, 2006.

"Infinitus, Digital Video Advertising iMotion Outdoor 65 Inch," Infinitus d.o.o., http://www.infinitus-outdoor.com, 2008.

"Infinitus, Digital Video Advertising Product Gallery," Infinitus d.o.o., http://www.infinitus-outdoor.com, 2008.

"Infinitus, Digital Video Advertising iMotion Outdoor 52 Inch," Infinitus d.o.o., http://www.infinitus-outdoor.com, 2008.

"Imotion® Products and Services of Infinitus, Slovenia," Infinitus Digital Video Oglasevanje d.o.o., Ljubljana, Feb. 2008.

"Waterproof TV Sales, Outdoor Advertising Display with "Optional Anti-Theft Bracket,"" Visionary AV Solutions Ltd., http://plasmas-directs.co.uk/, Apr. 24, 2008.

"Sunlight Readable LCD Monitors," SunlightLCD.com, http://www.sunlightlcd.com/outdoor-sunlight-readable-weatherproof-lcd-tv.html, Apr. 24, 2008.

"Christie Accessories & Options," Christie Digital Systems, Inc., http://www.christiedigital.com, Apr. 24, 2008.

"SunBriteTV All Weather Outdoor LCD Television Model 2310D," SunBright TV LLC, 2006.

"Suncutter LCD Display, The Professional's Choice in Outdoor LCD Technology," Suncutter LCD Display, http://www.suncutter.com, Apr. 24, 2008.

"Outdoor Television . . . Really! Suncutter LCD Display Screens," Suncutter LCD Display, http://www.suncutter.com, No date available.

"You have to see it to believe it, Suncutter LCD Screens," Suncutter LCD Display, http://www.suncutter.com, No date available.

"Slash Gear Television W104 Water Proof LCD TV for Your Bath or Pool," SlashGear, http://www.slashgear.com, Apr. 24, 2008.

"All-Weather Outdoor Ultra-Bright Flat-Screen HDTV and Accessories," Pantel, http://www.Panteltv.com, no date available.

"Sanyo Weatherproof 42" LCD Monitor," Sanyo North America Corp., 2008.

"Customer Print DGCA-32," Chief Manufacturing, Inc. http://www.chiefmfg.com/productdetail.aspx?AccessoryID=734, Aug. 20, 2007.

* cited by examiner ered therein by reference in their entirety. The contents of both applications are incorporated

DISPLAY ENCLOSURE

CROSS-REFERENCE TO RELATED APPLICATIONS

The present application is a continuation of U.S. patent application Ser. No. 12/949,349, filed Nov. 18, 2010, which is a continuation in part of U.S. patent application Ser. No. 12/719,185, entitled "Display Enclosure" and filed on Mar. 8, 2010. The contents of both applications are incorporated herein by reference in their entirety.

FIELD OF THE INVENTION

The present invention relates generally to structures for enclosing display devices. More particularly, the present invention relates to enclosures for protecting flat-panel display devices from ambient conditions encountered in a viewing location.

BACKGROUND OF THE INVENTION

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

In recent years, flat panel televisions have become enormously popular in both commercial and residential sectors. As the prices for plasma and liquid crystal display (LCD) flat panel displays have continued to fall, and the quality for the same devices have improved, more and more businesses and individuals have purchased such devices for both home and business purposes.

The advantages of flat panel displays has also led to expanded application and placement of display devices, including locating display devices in new and challenging and environments. For example, display devices might be located outdoors in various residential and commercial settings for entertainment or marketing purposes, potentially exposing the display device to damaging rain, snow, debris, and other elements. Display devices might also be located in indoor environments such as restrooms, kitchens, and industrial settings for various entertainment, marketing, and informational purposes. As with outdoor applications, liquids and other potential contaminants may be near or come into contact with the mounted display device, potentially damaging or degrading the performance of the display device. It is desirable to protect the display device, which is often quite expensive, from exposure to environmental and other potential contaminants. Accordingly, various, sometimes bulky, environmental enclosures have been developed that are intended to protect a display device from the elements and other containments to permit locating such displays outdoors and in other potentially inhospitable environments.

SUMMARY

Various embodiments of the present invention comprise enclosed display device systems and enclosure systems for display devices such as a LCD, LED or plasma flat panel display devices. These systems may be characterized by a low profile enclosure that supports an enclosed display device for viewing and protects the display device from adverse ambient conditions that may be encountered in a viewing location. For example, various the enclosure systems are substantially sealed and weatherproof, preventing ingress of liquids such as precipitation that may occur at an outdoor viewing location.

The enclosure may be sealed and weatherproofed using a number of techniques. In various embodiments, an adhesive or a combination of adhesives may be used to couple components of the enclosure together and to form appropriate seals. Additional components may be applied to portions of the enclosure to further effectuate sealing of the enclosure, including an application of various coatings. These coatings may be in a liquid form at the time of application and then cured to form a sealing surface. For example, various organic liquid coatings are capable of being sprayed onto to portions of the enclosure, after which the coatings may be chemically or thermally cured in place. The enclosure may also undergo additional or alternative processes and combinations thereof for sealing, including various thermal treatments such as heat treating. The result is an enclosure that is resistant to or substantially impervious to liquid ingress under ambient conditions encountered in an outdoor environment. Additionally, the materials and/or processes are such that the visible surfaces of the finished enclosure may also be aesthetically appealing, thereby avoiding the expense of additional finishing treatments, such that the enclosure is appropriate for use in an outdoor media environment.

The enclosure systems according to various embodiments also provide thermal protection for the enclosed display device. Modern flat panel display devices typically generate heat while in use. The heat load generated can be substantial under various circumstances. Consequently, the temperature within a sealed weatherproof enclosure can rapidly rise above the thermal operating range of the display device unless mitigated. Thermal conditions within the enclosure may be exasperated by ambient conditions, for example, high ambient temperatures and/or a high solar load on the display enclosure. Additionally, under low ambient temperatures it may be necessary to generate additional heat within the enclosure when the display device is on or off in order to protect the display device and/or maintain sufficient operating temperature within the enclosure. Accordingly, the enclosure systems may include active and/or passive thermal control devices to modulate the temperature within the enclosure.

Additionally and according to various embodiments, low profile protective enclosures may extend only minimally beyond the periphery of the display area of the display device. In other words, it is desirable to minimize the thickness of the enclosure about the perimeter of the display device when observed from a viewing angle.

With the above considerations in mind, in one set of embodiments, a protectively enclosed flat panel display device comprises a protective enclosure substantially impervious to liquid ingress under ambient conditions that are encountered in an outdoor environment. The protective enclosure comprises a rigid bezel defining a periphery of the protective enclosure. The rigid bezel is characterized by a front bezel surface having a first opening and further characterized by a second opening substantially opposite the first opening. A sealant coats at least a portion of the rigid bezel and provides a surface over the rigid bezel substantially impervious to liquid ingress. A substantially transparent front cover is coupled to the front bezel surface and covers the first opening and a rear cover assembly is coupled to the rigid bezel and substantially covers the second opening.

In another set of embodiments, a display enclosure for enclosing a flat panel display device for viewing in an outdoor environment, comprises a bezel characterized by a perimeter surface defining an enclosure area having a display opening and a rear opening. An organic coating is disposed on the perimeter surface and forms a weather resistant seal on the bezel. A front cover is coupled to the bezel and disposed over the display opening. A rear cover assembly is coupled to the bezel and substantially covers the rear opening.

In yet another set of embodiments, a method of preparing a substantially sealed protective enclosure for a display device, comprises assembling a rigid bezel by joining a plurality of frame members. The rigid bezel is characterized by a display opening and a rear opening and includes a plurality of lateral surfaces substantially defining an outer peripheral surface of the protective enclosure. The method further comprises applying a liquid sealant on the outer peripheral surface, and curing the liquid sealant to form a protective coating on the rigid bezel. The method further includes attaching a front cover to the rigid bezel, attaching a rear cover to the rigid bezel, and placing a display device within the enclosure.

These and other features of the invention, together with the organization and manner of operation thereof, will become apparent from the following detailed description when taken in conjunction with the accompanying drawings, wherein like elements have like numerals throughout the several drawings described below.

DETAILED DESCRIPTION OF VARIOUS EMBODIMENTS

Figure 1:
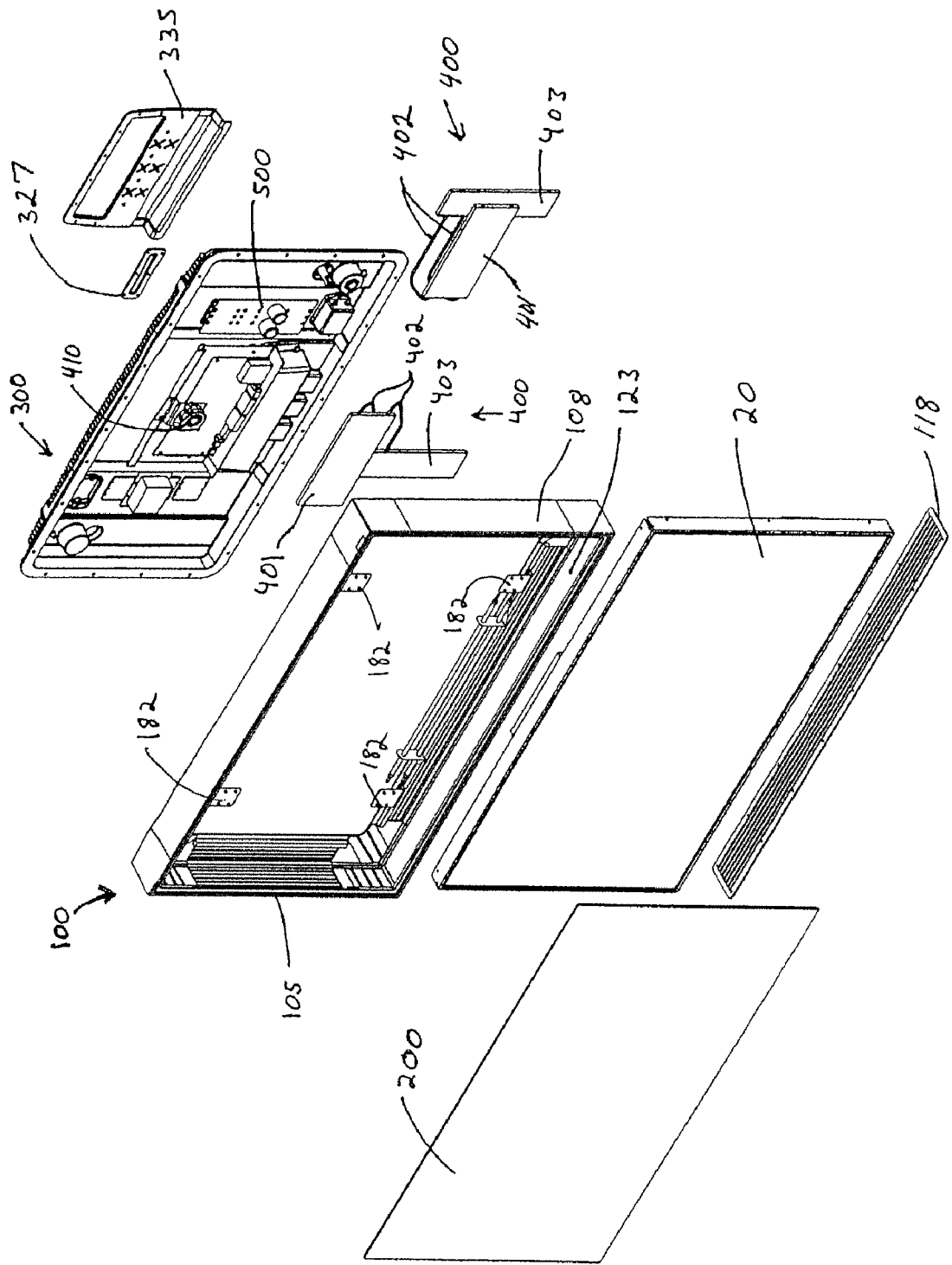
FIG. 1 is an exploded view of an enclosed display device constructed in accordance with an embodiment of the present invention.

FIGS. 1-7 illustrate a display enclosure 10 constructed in accordance with an embodiment of the present invention. The display enclosure 10 is a protective enclosure configured to enclose a display device 20 such as a LCD, LED or plasma flat panel display device. The display enclosure 10 comprises a bezel 100 that defines a frame disposed about the periphery of the display device 20. A front cover 200, or display cover, is coupled to the bezel 100 and covers a display opening 111, or front opening, defined by the bezel 100. The front cover 200 comprises a substantially transparent material that permits viewing of the display device 20 within the display enclosure 10. The display enclosure 10 further comprises a rear cover assembly 300 coupled to the bezel 100. The rear cover assembly 300 covers a rear opening 311, opposite the display opening 111, defined by the bezel 100. The rear cover assembly 300 may include a heat sink portion and a cable entry portion 350 that permits passage of various power, video, audio, and other data carrying cables.

The display enclosure 10 is constructed so that the display device 20 may be located in an outdoor viewing environment or in other environments where the display device 20 requires or may benefit from protection from ambient conditions. Accordingly, the display enclosure 10 is constructed to resist and substantially prevent ingress of various liquids that may be encountered in the viewing location, including precipitation when the display enclosure 10 is mounted for outdoor viewing of the display device 20. In various embodiments, the display enclosure 10 is constructed to prevent ingress of rain, snow and splashing liquid. In a particular embodiment, the display enclosure 10 is constructed to prevent ingress of liquid at a submersed depth of up to five feet of water, which may correspond to a modified rating of the IP68 standard (the contents of which are incorporated herein by reference).

As described in detail below, the display enclosure 10 may be provided with features that enable or enhance performance and operation under various ambient conditions, while protecting the display device 20 from adverse conditions such as liquids that may come into contact with the display enclosure 10. The bezel 100, for example, may be constructed to provide the display enclosure 10 with a narrow periphery, or a low profile, that closely surrounds the display opening 111 through which the display area of the display device 20 is visible. Thus, the outer periphery of the bezel 100 defines an area and the display opening 111 defines a display opening area. In this configuration, the distance between an inner edge of the bezel 100 and the periphery of the bezel 100, the bezel thickness, is minimized. In a particular embodiment, the bezel thickness is less than about 50 mm, and in a further embodiment, the bezel thickness is less than about 25 mm. In further embodiments, the bezel thickness may fall between about 25 mm and about 50 mm.

The low profile of the bezel 100 permits the display area of the display device 20 to closely approach the periphery of the bezel 100. For example, the display opening area is maximized relative to the enclosure area. In a particular embodiment, the display opening area is at least about 85 percent of the enclosure area, and in another embodiment, the display area opening is at least about 92 percent of the enclosure area. In further embodiments, the display area opening may fall between about 85 percent and about 92 percent of the enclosure area. The above described configurations offer a clean, low profile look where the edge of the display area of the display device 20 is in proximity of the periphery of the display enclosure 10. These configurations permit, for example, a plurality of enclosures 10, each with a display device 20, to be arranged in a video wall such that the respective display devices 20 are in close proximity to one another, thereby enhancing the presentation of the image or images displayed on the display devices 20.

The display enclosure 10 may also include thermal modulation features. Such thermal modulation features may be active and/or passive and provide temperature control within the display enclosure 10 to assist in maintaining an internal temperature within the display enclosure 10 that is within an operating range of the display device 20. Still further, the display enclosure 10 may include various additional features that, for example, sense ambient light conditions and communicate with the display device 20 to adjust the brightness of the display to enhance viewability of the display device 20 under various light conditions.

Figure 2:
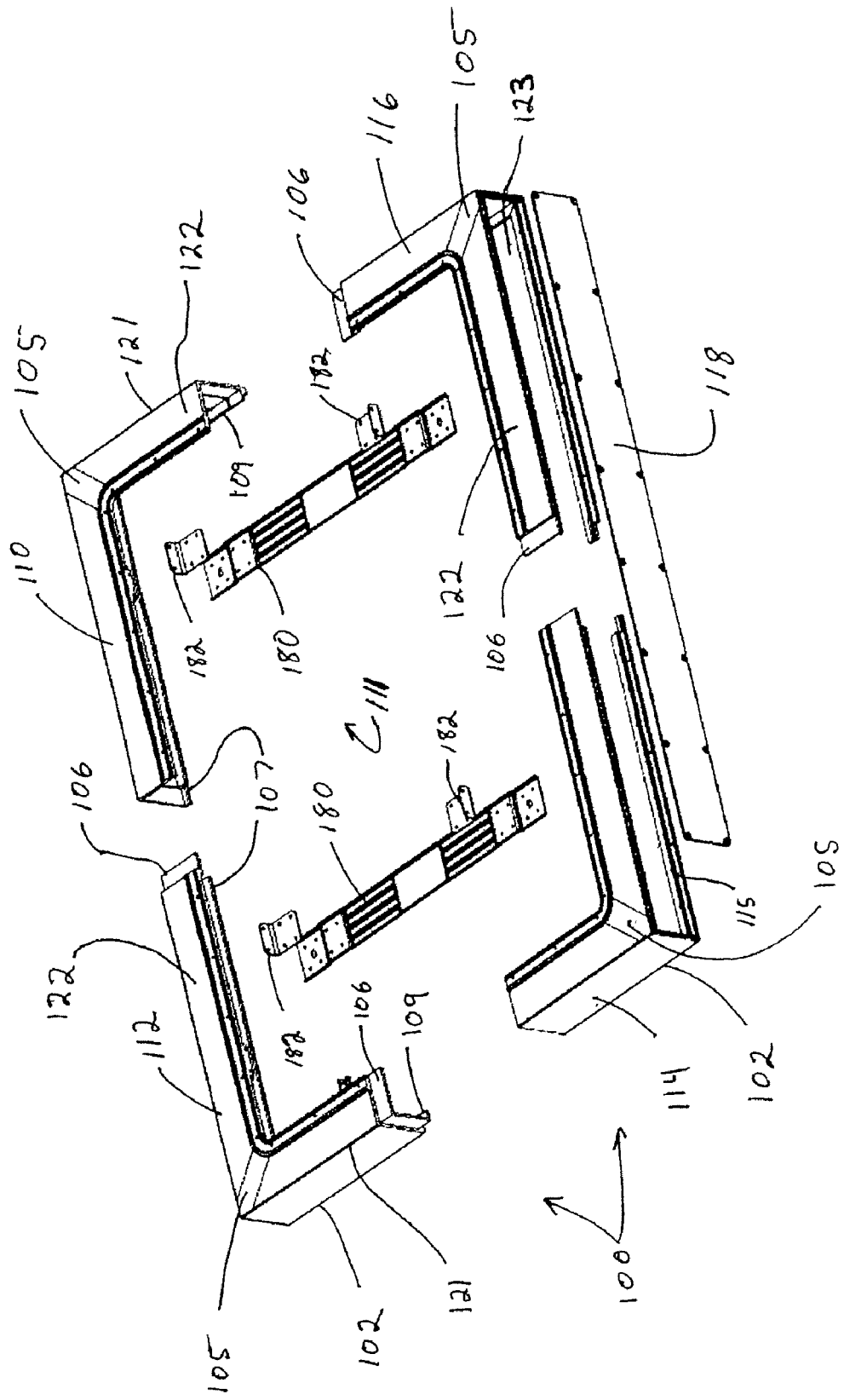
FIG. 2 is an exploded view showing the bezel and display brackets of the enclosed display device of FIG. 1.

As shown in FIG. 2, the bezel 100 defines the periphery of the display enclosure 10. The bezel 100 is generally sized such that the display device 20 fits within the region defined by the bezel 100. The bezel 100 may comprise a plurality of frame members 105 that are assembled to define the bezel 100. As shown, each of the plurality of frame members 105 is generally of a modified "C-shape" where a rear surface of the member may extend inwardly from a lateral surface beyond a front surface of the member. However, other configurations may also be used, including "L-shaped" and other shaped frame members. The plurality of frame members 105 may be constructed of metal such as aluminum or other material capable of providing sufficient strength and rigidity, while maintaining a low peripheral profile for the display enclosure 10. In the depicted embodiment, the frame members include a first upper frame 110, a second upper frame 112, a first lower frame 114, and a second lower frame 116. The bezel 100 further includes a lower plate 118 coupled to the first lower frame 114 and the second lower frame 116. However, other configurations of the bezel 100 may be constructed, including a single-piece frame, two-piece frame, and frames comprising even more pieces.

As depicted in FIG. 2, each of the plurality of frame members 105 includes a frame interface 106 disposed on at least one end of the respective member. When the bezel 100 is assembled, each of the frame interfaces 106 is received by an adjacent frame member 105. The plurality of frame members 105 are assembled to form the perimeter of the bezel 100, defining an outer or peripheral surface 108. The plurality of frame members 105 may be joined using an adhesive such as a high-strength epoxy. However, other techniques for joining the frame members 105 may also be used, including other adhesives, connecting elements, welding, and combinations thereof. The first lower frame 114 and the second lower frame 116 may further include a lower flange 115 configured to interface with the lower plate 118. The lower flange 115 defines a lower opening 123 in the bezel 100. The lower opening 123 is sized to receive the display device 20 during manufacturing of the display enclosure 10. The lower plate 118 is coupled to the first lower frame 114 and the second lower frame 116 at the lower flange 115. The lower plate 118 may be joined to the lower flange 115 by various techniques, including a plurality of connecting elements, adhesive bonding, welding, and combinations thereof. Regardless of the specific construction of the bezel 100, it will be appreciated that, in use, the bezel 100 provides support for the display device 20 and is substantially impervious to liquids and prevents ingress of liquids and other containments into the display enclosure 10 that may be encountered in the mounting environment.

Once the plurality of frame members 105 are joined to form the perimeter of the bezel 100, the bezel 100 may undergo an additional treatment or plurality of treatments. These treatments can include, for example, applying an organic coating and/or sealant to the bezel 100, which may be utilized to enhance resistance to environmental effects, strengthen the bezel, and/or provide a decorative coating. Various treatments can include polyurea coatings, urethane coatings, polyurethane coatings, epoxy coatings, powder coating, painting, anodizing, and combinations thereof. The material utilized in a particular treatment may be characterized as being adherable to the bezel 100 or an intermediate material disposed on the bezel and durable under various environmental conditions. Additionally, it may be desirable for the treatment to be characterized by one or more cosmetic attributes such as an ability to conceal surface imperfections in the bezel 100, including seams between the frame members 105, as well as providing a color, texture, and finish suitable for an outdoor display enclosure.

In an embodiment, the bezel 100 is treated with a polyurea coating. The polyurea coating may be applied as a liquid to portions of the bezel 100, such as the external surfaces or selected surfaces, or may be applied to the entire bezel 100. Selected surfaces of the bezel 100 may be coated by masking or other techniques. Application of the polyurea coating may be accomplished by a spray process. In various embodiments, the polyurea coating comprises a two-component system that includes a catalyst to effectuate curing of the polyurea on the bezel 100 at room temperature and without the need for a subsequent heat treating operation. In a particular embodiment, the two-component polyurea has the product designation UL XT 66 and is available from Ultimate Linings, LTD, of Houston, Tex. After curing, the polyurea coating provides a weatherproof seal or surface over the applied portions of the bezel.

Various processes may be used to apply the organic coating to the bezel 100, including by pumping the material to a spraying device. Proportioning valves achieve the desired ratio of the two-components, which are mixed into a blended flow prior to discharge from the spaying device onto the bezel. Prior to application, the viscosity of the polyurea may lowered by heating the material in order to improve pumping efficiency and spraying. In a particular embodiment, the components of a two-component polyurea system are heated to about 150° F. In a particular embodiment, the components are proportioned and heated using a Reactor™ proportioning and heating system from Graco Inc. of Minneapolis, Minn.

Two-component polyurea provides a highly durable and weatherproof coating over the bezel 100. In addition to durability, the polyurea can provide an aesthetic finish that does not require a subsequent painting or coating step or a post-application heat treatment step to cure the coating. For example, where the bezel 100 includes external seams between the frame members 105, the polyurea coating can be applied and cured to form a surface that effectively conceals the seams to provide a finish with a uniform surface appearance on the bezel 100. The amount of material applied may be varied to achieve the desired thickness of the coating. In a particular embodiment, a finished polyurea coating of about 0.060 inches is utilized. Accordingly, a two-component polyurea system can enhance manufacturability and efficiency relative to conventional multi-step finishing processes.

Figure 5A:
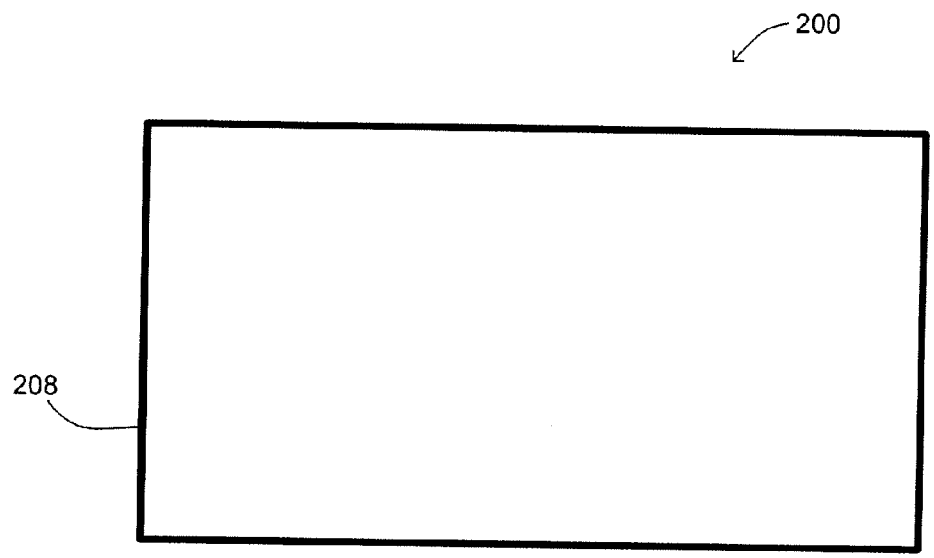
FIG. 5A is a front plan view of the front cover of the enclosed display device of FIG. 1.
Figure 5B:
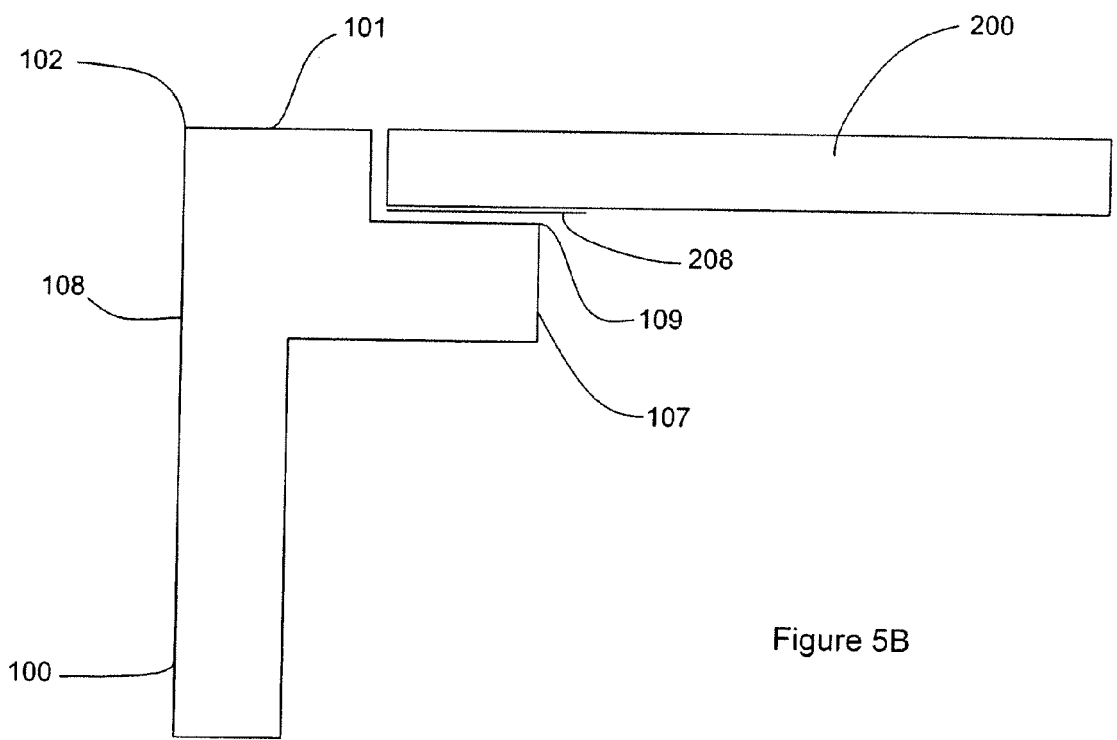
FIG. 5B is a cross section showing a portion of the bezel and the front cover of the enclosed display device of FIG. 1.

With reference to FIGS. 2 and 5B, the plurality of frame members 105 may form an inner edge 107 along a bezel front surface 101 that extends from a front edge 102 of the bezel 100 that defines the display opening 111. The display area of the display device 20 is visible through the display opening 111. As such, the bezel 100 may be constructed to various dimensions to accommodate display devices 20 of different sizes. For example, the bezel 100 may be constructed in accordance with display device screen sizes that are commonly manufactured. In a particular embodiment, the bezel 100 is constructed to accommodate a 42 inch display device 20.

The bezel 100 is constructed such that the thickness of the bezel, i.e., the normal distance between the inner edge 107 and the peripheral surface 108, the portion visible when viewing the display enclosure 10 from the front, is minimized. That is, the bezel 100 has a low profile surrounding the display opening 111. For example, in a particular embodiment, the distance between inner edge 107 and the outer surface of the display enclosure 10 is less than about 25 mm. In other words, the area of the display opening 111 is maximized relative to the area of the display enclosure 10 defined by the peripheral surface 108. For example, in a particular embodiment, the area of the display opening 111 is at least about 92 percent of the area of the display enclosure 10. The low peripheral profile of the bezel 100 may enhance the overall look of the display enclosure 10, as well as minimizing the space needed in a mounting location for installation of an enclosed display. In multiple screen arrangements, where several displays are positioned horizontally and/or vertically next one another, the low profile of the bezel 100 may provide an enhanced seamless appearance of the displayed image(s) on the multiple display devices 20.

The display opening 111 is covered by the front cover 200. As shown in FIG. 2 and FIG. 5B, the front cover ledge 109 may be disposed along the inner edge 107 and be recessed from the bezel front surface 101 to receive the front cover 200. The front cover ledge 109 may be recessed from the bezel front surface 101 about the thickness of the front cover 200 so that the bezel front surface 101 and the front cover 200 define a substantially smooth surface. In other words, the surface of the front cover 200 is neither perceptibly raised above, nor depressed below the bezel front surface 101. Alternatively, the front cover 200 may extend over the front of the bezel front surface 101 to the outer edge of bezel 100 or a portion thereof. In yet another embodiment, the front cover 200 may be disposed in back of the bezel front surface 101 and received within the bezel 100.

FIGS. 1, 5A and 5B show the front cover 200, which attaches to a front portion of the bezel 100. The front cover 200 comprises a plate of a substantially transparent material that permits viewing of the display device 20 within the display enclosure 10. Accordingly, the front cover 200 may comprise glass or a substantially transparent plastic. In a particular embodiment, the front cover 200 comprises tempered glass. The front cover 200 is joined to the bezel 100 in a manner that prevents ingress of liquids into the display enclosure 10. For example, the front cover 200 may be bonded to the bezel 100 using an adhesive such as a urethane adhesive. As shown in FIGS. 5A and 5B, the front cover 200 may include a border 208 that may be substantially opaque, on the front and/or rear surfaces about the periphery to mask the bonding region between the front cover 200 and the front cover ledge 109. The front cover 200 may further include an anti-reflective coating on the front and/or rear surfaces to reduce photopic reflection. The front cover 200 may also be treated to mitigate ambient ultraviolet (UV) light degradation of the polarizer module of the display device 20. For example, the front cover 200 may include a UV coating configured to shield the polarizer from at least a portion of ambient UV radiation. In various embodiments, the front cover 200 is of sufficient strength to withstand ambient conditions when the display enclosure 10 is located for outdoor viewing. In a particular embodiment, the front cover 200 comprises tempered glass of about 4 mm in thickness.

Figure 3A:
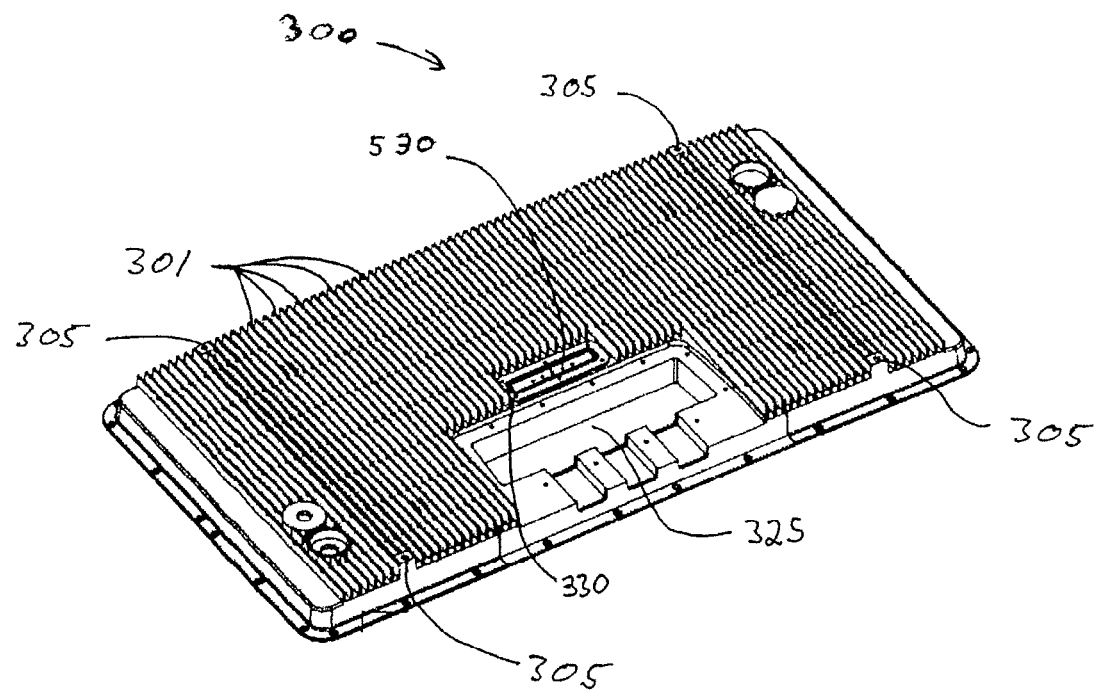
FIG. 3A is a perspective view of the rear cover assembly of FIG. 1.
Figure 4:
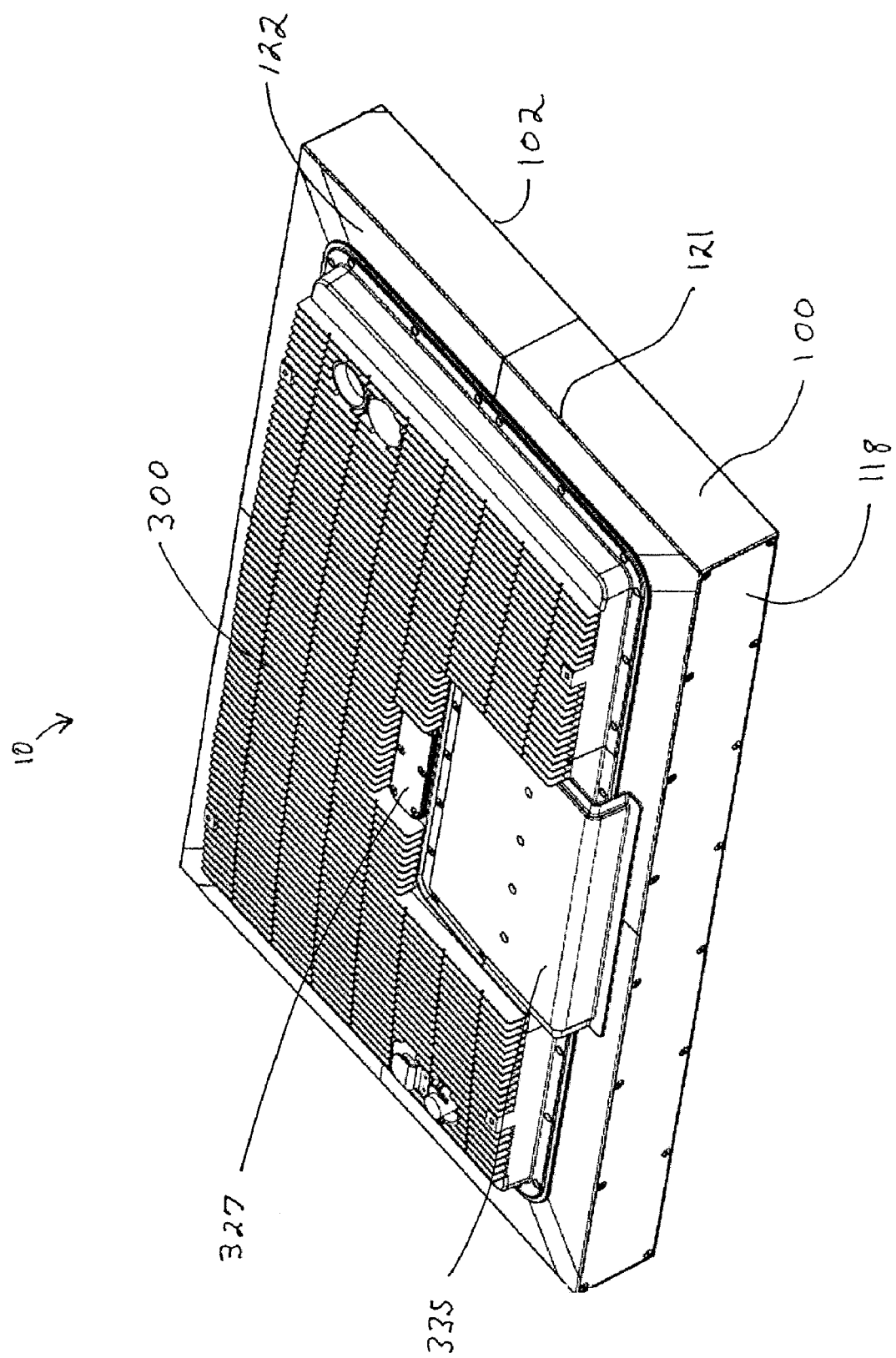
FIG. 4 is a rear perspective view of the enclosed display device of FIG. 1.

As shown in FIGS. 1 and 4, a rear cover assembly 300 covers the rear portion of the display enclosure 10. More particularly, the rear cover assembly 300 covers the rear opening 311 defined by the bezel 100. The rear cover assembly 300 is attached to a rear surface 122 extending from a rear edge 121 of the bezel 100. The rear cover assembly 300 is joined to the bezel 100 in a manner that prevents ingress of liquids into the display enclosure 10. A plurality of connecting elements may be received about the perimeter of the rear cover assembly 300 in order to join the rear cover assembly 300 to the bezel 100. The use of removable connecting elements allows for installation of and access to the display device 20 within in the display enclosure 10. It will be appreciated that the connection of the rear cover assembly 300 to the bezel 100 is configured to prevent ingress of liquid into the display enclosure 10. In an embodiment, a gasket may be disposed between the rear cover assembly 300 and the bezel 100 to provide appropriate sealing of the display enclosure 10. The rear cover assembly 300 also serves as a heat sink, dissipating heat generated from within the display enclosure 10 to the environment outside the enclosure. As such, at least a portion of the rear cover assembly 300 may comprise a material having a relatively high thermal conductivity. For example, in an embodiment, the rear cover assembly 300 comprises die cast aluminum. As depicted in FIG. 3A, the rear cover assembly 300 assembly may include a heat sink portion that comprises a plurality of fins 301 disposed on the outer surface to enhance convective transfer of heat generated from within the display enclosure 10 to the environment.

In various embodiments, the display enclosure 10 is constructed by assembling the plurality of frame members 105 to form the bezel 100. After the bezel 100 is formed, the display device 20 is introduced into the region defined by the bezel 100 through the lower opening 123. With the display device 20 in place within the region defined by the bezel, the lower plate 118 is secured to the bezel 100. By introducing the display device 20 through the lower opening 123 several advantages may be achieved, including a low profile for the bezel 100 and a well sealed enclosure. Because the display device 20 is introduced through the lower opening 123, the dimensions of various portions of the bezel 100 may be increased. For example, the rear surface 122 may be extended towards the interior of the bezel 100 to enhance the structural integrity of the display enclosure 10 with no increase in the profile of the bezel 100 because the display device 20 need not fit through the rear opening defined by the rear surface 122. Additionally, extending the rear surface 122 permits the front portions of the bezel 100, including the front surface 101 and the front cover ledge 109, to have a low profile.

Figure 3B:
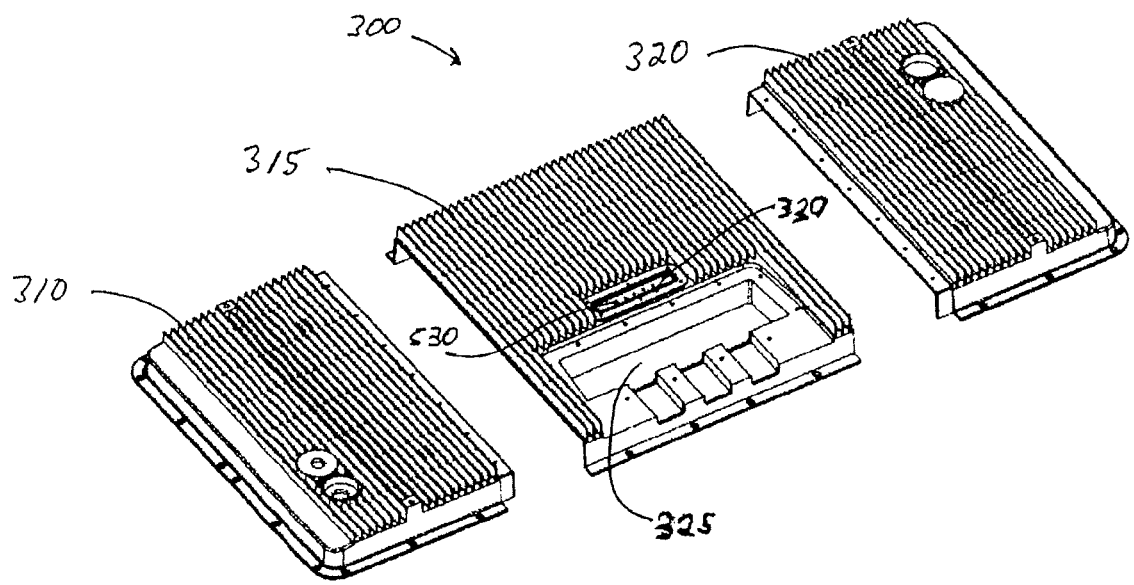
FIG. 3B is exploded view of the rear cover assembly of FIG. 3A.

FIG. 3B shows an embodiment of the rear cover assembly 300 that comprises a plurality of panels, including a left panel 310, a central panel 315, and a right panel 320, that are coupled together. Similar to the bezel 100, the left panel 310, the central panel 315, and the right panel 320 may be joined using a high-strength adhesive such as epoxy but may be attached using other techniques, including connecting elements, welding, and combinations thereof. As shown in FIG. 3A, the rear cover assembly 300 may include a plurality of mount attachment features 305 that permit the display enclosure 10 to be coupled to a pedestal, wall mount, ceiling mount, or other mounting system. In an embodiment, the plurality of mount attachment features 305 comprises openings disposed in the rear cover assembly according to an industry standard pattern. The rear cover assembly 300 may include an access area 325 as shown in FIGS. 3A and 3B. The access area 325, for example, provides envy for power and signal cables coupled to the display device 20. With reference to FIGS. 3A and 4, an access cover 327 is attachable to the rear cover assembly 300 and may include cable glands to seal the cable entries, preventing ingress of liquid into the display enclosure 10 at the cable entry point. The rear cover assembly 300 may include a display control access 330 for an on screen display (OSD) interface 530. The OSD interface 530 may include a number of inputs operable by a user that allow for manual control and/or adjustment of settings of the display device 20. A cable entry cover 335 may be installed over the display control access 330 to prevent ingress of liquids into the display enclosure 10.

The display enclosure 10 may include internal supports disposed within the display enclosure 10. As depicted in FIG.

2, the display enclosure 10 includes display brackets 180. The display brackets 180 are attachable to a rear portion of the display device 20. The display brackets 180 generally comprise elongated members with openings for receiving connecting elements to secure the display device 20. The display brackets 180 may be directly coupled to the bezel 100 or, as depicted, by connecting brackets 182 attachable to the bezel 100. The display brackets 180 secure the display device 20 in the display enclosure 10 and provide additional rigidity to the display enclosure 10.

Various thermal control devices may be disposed within or at least partially within the display enclosure 10, to assist in maintaining the internal temperature of the display enclosure 10. Thermal control may be accomplished by including devices intended to add and/or remove heat from the display enclosure 10 depending on ambient conditions and/or the operating conduction of the display device 20. The various thermal control devices may work independently or in concert to assist in modulating the temperature inside the display enclosure 10 within the operating temperature range and/or storage temperature range of the display device 20 under various ambient conditions. In a particular embodiment, the display enclosure 10 is capable of maintaining the internal temperature inside the enclosure within the operating range of the display device 20 for an ambient temperature range of between about 1° C. and about 60° C. The thermal control devices within the display enclosure 10 may comprise passive and/or active devices.

Figure 6A:
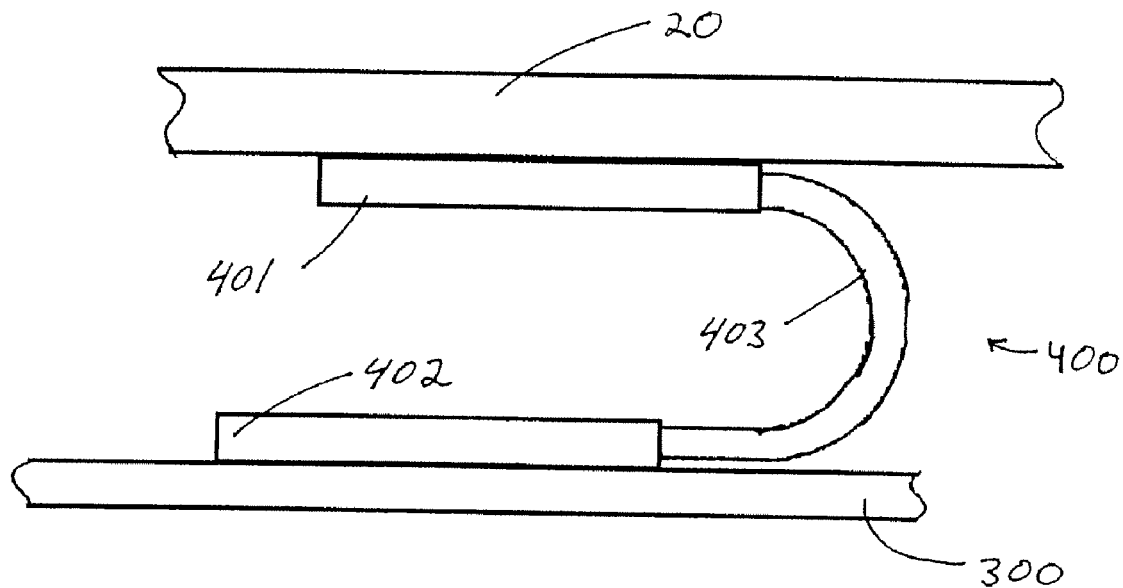
FIG. 6A is a cross section showing a portion of the display device, a portion of the rear cover assembly and the heat pipe assembly of the enclosed display device of FIG. 1.
Figure 6B:
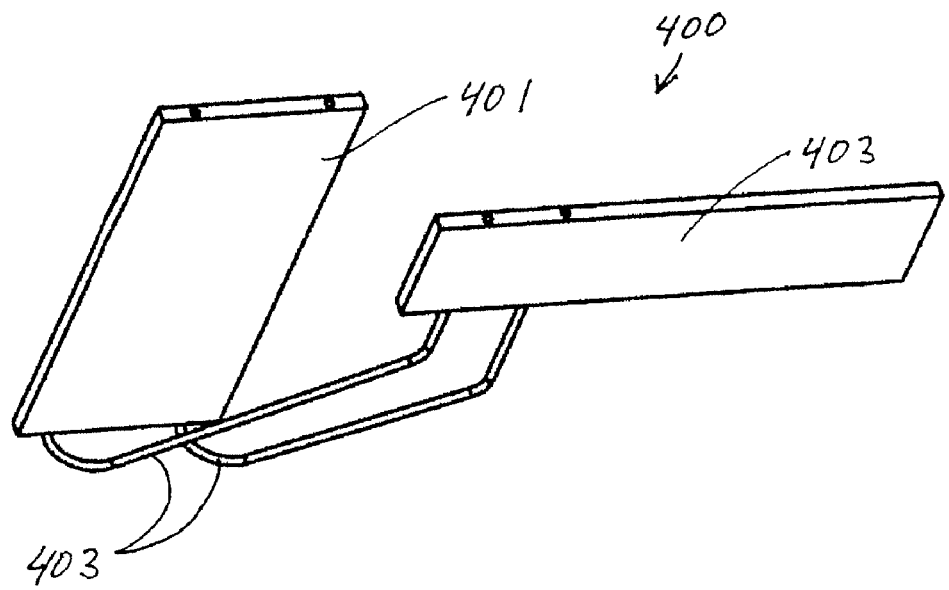
FIG. 6B is a perspective view showing the heat pipe assembly of FIG. 6A.

One of the thermal control devices within the display enclosure 10 may comprise a heat pipe assembly 400. As shown in FIG. 1, the display enclosure may include a plurality of heat pipe assemblies 400. With reference to FIGS. 6A and 6B, the heat pipe assembly 400 is coupled to the display device 20 and the rear cover assembly 300. The heat pipe assembly 400 conducts heat generated by the display device 20 to the rear cover assembly 300, which as described above, may comprise a material of relatively high thermal conductivity as well as a plurality of fins 301 for dissipating heat from the display enclosure 10 to the environment. The heat pipe assembly 400 comprises a thermal connecting element 402 that thermally couples a display device heat spreader 401 and a rear cover heat spreader 403. The display device heat spreader 401 may be directly or operatively coupled to a rear portion of the display device 20. The rear cover heat spreader 403 is directly or operatively coupled to the rear cover assembly 300. Heat generated by the display device 20 is consequently conducted via the heat pipe assembly 400 to the rear cover assembly 300. It will be appreciated that the effectiveness of the heat pipe assembly 400 to achieve temperature control within the display enclosure 10 will depend on the area of the interfaces, quality of the interfaces, and location of the display device heat spreader 401 in relation to the display device 20 and the heat generating portions thereof.

Figure 7:
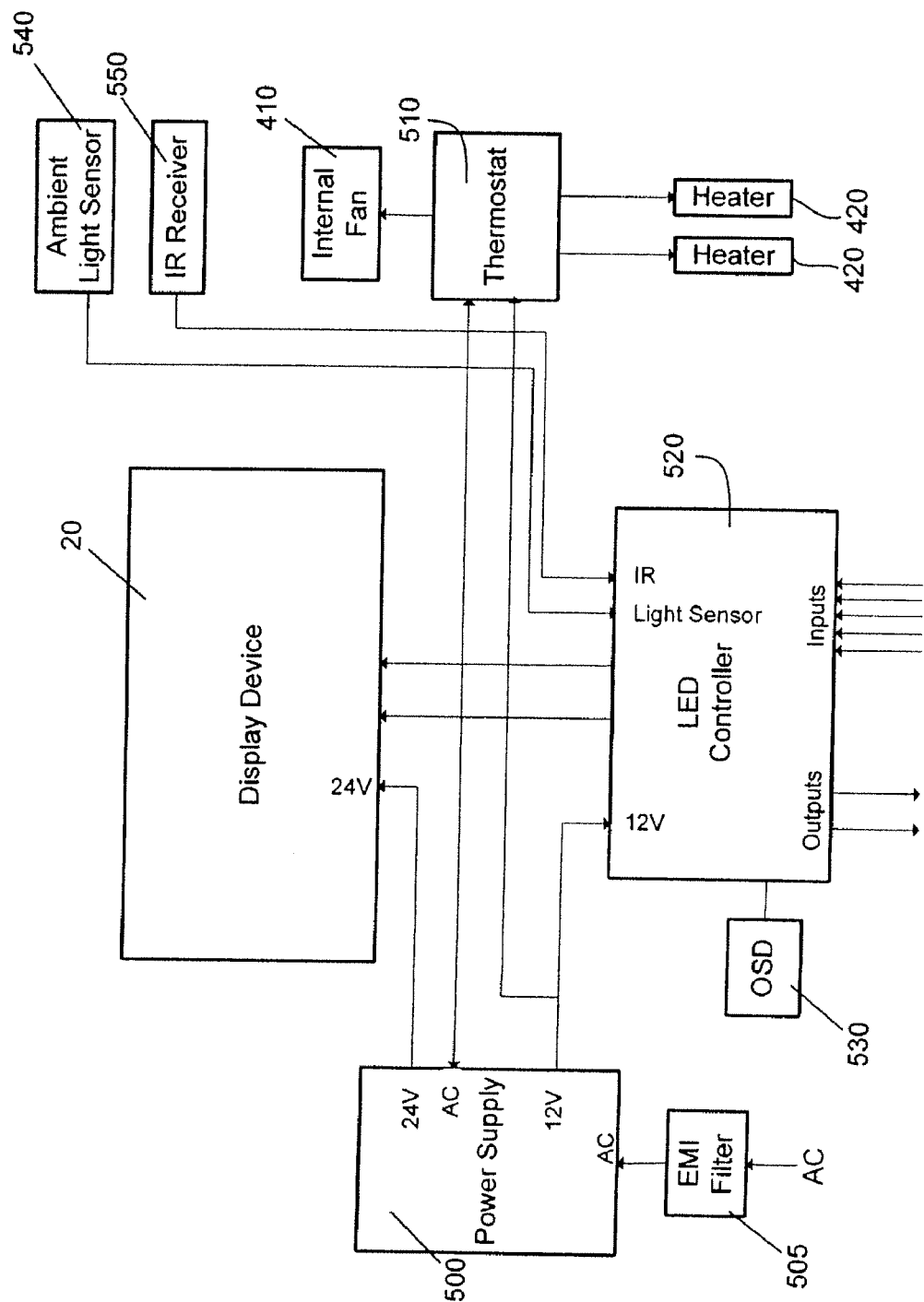
FIG. 7 is a schematic illustrating components of the enclosed display device of FIG. 1.

The display enclosure 10 may also include an internal fan 410 located within the display enclosure 10 as shown in FIG. 1. The internal fan 410 circulates air within the display enclosure 10, mitigating thermal gradients or hot spots on, for example, a surface of the display device 20 and regions within the display enclosure 10. The internal fan 410 is electrically coupled to a power source to provide operating power. In an embodiment, and as depicted in FIG. 7 and described more fully below, a power supply 500 may be included within the display enclosure 10 to provide direct or indirect power to the internal fan 410 and other devices within the display enclosure 10. The internal fan 410 may also be electrically coupled to a thermal control unit 510. In an embodiment, the thermal control unit 510 may comprise a thermostat that is capable of detecting a temperature within the display enclosure 10 and/or on the display device 20. In a particular embodiment, a dual temperature integrated circuit sensor is mounted to the thermal control unit 510. The thermal control unit 510 may be equipped with one or more temperature set points. The thermal control unit 510 may activate the internal fan 410 (or other thermal control device) when a first temperature set point is detected, for example, 30° C. The internal fan 410 then operates, mixing the air within the display enclosure 10, for a predetermined period, until the detected internal temperature falls below the first temperature set point, or the thermal control unit 510 otherwise shuts off the internal fan 410.

With reference to FIGS. 1 and 7, a heating element 420 may be located within the display enclosure 10 to facilitate operation of the display device 20 under ambient temperature conditions that fall below the operational range or that would degrade the operation of the display device 20. The heating element 420 may also be operated while the display device 20 is off or in sleep mode, to mitigate damage to the display device 20 that could be caused by ambient temperatures below the storage temperature of the device. Various heating devices and combinations thereof may be used in the display enclosure 10. In a particular embodiment, the heating element 420 comprises one or more electrical strip heaters. Like the internal fan 410, the heating element 420 is electrically coupled to a power source for operation such as the power supply 500. The heating element 420 may have its own control or be electrically coupled to the thermal control unit 510. Where the heating element 420 is coupled to the thermal control unit 510, the thermal control unit 510 activates the heating element 420 upon detecting a temperature within the display enclosure 10 that falls below a second temperature set point. In a particular embodiment, the second temperature set point is set at 5° C. The heating element 420 operates, elevating the temperature within the display enclosure 10, for a predetermined period, until the detected internal temperature rises above the second temperature set point, or the thermal control unit 510 otherwise shuts off the heating element 420.

As noted above and as shown in FIG. 1, the power supply 500 may be mounted within the display enclosure 10. The power supply 500 is electrically coupled to a power source, for example, directly or indirectly to a conventional power grid or other source. As shown in FIG. 7, an EMI filter 505 may be included between the power source and the power supply 500. The power supply 500 may be used to power internal devices, for example, the internal fan 410, the heating element 420, and the thermal control unit 510, located within the display enclosure 10. The power supply 500 may also be configured to supply power to the display device 20. In addition to the display device 20, the power supply 500 may be a significant heat generator that may raise the internal temperature within the display enclosure 10 when in operation. Accordingly, the power supply 500 may include one or more heat sinks operatively coupled to the rear cover assembly 300 to facilitate dissipation of heat generated within the display enclosure 10.

In addition to the devices already described, a display controller 520 that controls the display device 20 may be mounted within display enclosure 10. Alternatively, the controller may be integral with the display device 20. As shown in FIG. 7, the display controller 520 is electrically coupled to the power supply 500, the display device 20, and the OSD interface 530. The display controller 520 includes inputs for receiving typical audio/visual signals, e.g., HDMI, VGA, PC audio input, component video, S-video, composite video, SPDIF, audio inputs, and ATSC/cable tuner. The display controller 520 includes processing components for output of a signal for display by the display device 20. An audio output from the display controller 520 may be directed to the display device 20 or to stand alone audio equipment that may be situated outside the display enclosure 10. The display controller 520 is also coupled to OSD accessible from the rear of the display enclosure 10.

The display enclosure 10 may also be provided with an ambient light sensor 540. The ambient light sensor 540 senses the light level outside the display enclosure 10 and may be mounted to the bezel 100 or beneath the front cover 200. The ambient light sensor 540 is electrically coupled to the power supply 500 and the display controller 520. The display controller 520 receives input from the ambient light sensor 540 and, based on the input signal, may be configured to adjust the displayed image, for example, the brightness and/or the contrast, generated by the display device 20. For instance, under relatively low ambient light conditions, such as at night when the display enclosure 10 is located outdoors, the display controller 520 may be configured to automatically decrease the brightness of the display device 20 based on the input from the ambient light sensor 540.

The display enclosure 10 may also be equipped with features that enable communication between the display device 20 and a remote control device configured to control and the display device 20. The display enclosure 10 may include a remote control input 550. The remote control input 550 comprises an infrared sensor in a particular embodiment. The remote control input 550 is electrically coupled to the display controller 520 and may be mounted to the bezel 100 or located beneath the front cover 200 to receive input from a separate remote control device configured to control the operation of the display device.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. The embodiments were chosen and described to explain the principles of the present invention and its practical application to enable one skilled in the art to utilize the present invention in various embodiments and with various modifications as are suited to the particular use contemplated.

What is claimed is:

1. A protectively enclosed flat panel display device having a display region viewable from outside thereof, comprising:
    a protective enclosure substantially impervious to liquid ingress under ambient conditions encountered in an outdoor environment, the protective enclosure including a rigid bezel defining a viewing region, a substantially transparent front cover coupled to the rigid bezel and covering the viewing region and a rear cover assembly operatively connected to a rear portion of the rigid bezel; and
    a sealant coating that coats at least a portion of the rigid bezel, the sealant coating rendering the rigid bezel substantially impervious to liquid ingress.

2. The protectively enclosed flat panel display device of claim 1, wherein the sealant coating comprises an organic coating configured to adhere to the rigid bezel.

3. The protectively enclosed flat panel display device of claim 2, wherein the sealant coating comprises a polyurea material.

4. The protectively enclosed flat panel display device of claim 3, wherein the polyurea material comprises a sprayable material capable of being applied to the rigid bezel as a liquid and curable on the rigid bezel.

5. The protectively enclosed flat panel display device of claim 4, wherein the polyurea material comprise a plurality of components catalytically curable at about room temperature on the rigid bezel.

6. The protectively enclosed flat panel display device of claim 2, wherein the polyurea material is preheated before being applied to the rigid bezel.

7. The protectively enclosed flat panel display device of claim 1, wherein the sealant coating possesses a thickness of about 0.060 inches after application on the rigid bezel.

8. A display enclosure for enclosing a flat panel display device for viewing in an outdoor environment, comprising:
    a bezel defining a perimeter surface describing an enclosure area having a display opening;
    a substantially transparent front cover coupled to the bezel and covering the display opening; and
    a rear cover assembly operatively coupled to the bezel, the rear cover cooperating with the rigid bezel and the substantially transparent front cover to enclose flat panel display device contained therein; and
    an organic coating disposed on an outer surface of the bezel and forming a weather resistant seal over the bezel, wherein the display enclosure is resistant to liquid ingress in an outdoor viewing environment.

9. The display enclosure of claim 8, wherein the organic coating comprises a polyurea material.

10. The display enclosure of claim 9, wherein the polyurea material comprises a sprayable material capable of being applied to the bezel.

11. The display enclosure of claim 9, wherein the polyurea material comprises a two-component material curable at room temperature.

12. The display enclosure of claim 9, wherein the polyurea material is preheated before being applied to the rigid bezel.

13. The display enclosure of claim 8, wherein the sealant coating possesses a thickness of about 0.060 inches after application on the rigid bezel.

14. A method of preparing a substantially sealed protective enclosure for a display device, comprising:
    assembling a rigid bezel by joining a plurality of frame members, the rigid bezel characterized by a display opening, the rigid bezel including a plurality of lateral surfaces substantially defining an outer peripheral surface of the protective enclosure;
    applying a liquid sealant on the outer peripheral surface;
    curing the liquid sealant to form a protective coating on the rigid bezel;
    attaching a front cover to the rigid bezel, the front cover covering the display opening; and
    attaching a rear cover assembly to the rigid bezel,
    wherein the protective enclosure is substantially impervious to precipitation in an outdoor environment.

15. The method of claim 14, wherein the liquid sealant is applied after the assembly of the rigid bezel.

16. The method of claim 14, wherein the liquid sealant is applied by spraying onto the outer peripheral surface.

17. The method of claim 14, wherein the liquid sealant, when applied to the rigid bezel, conceals seams formed between individual frame members of the rigid bezel.

18. The method of claim 14, wherein the liquid sealant comprises a two-component polyurea having a catalyst component configured to effectuate curing at room temperature.

19. The method of claim 14, wherein the liquid sealant is preheated prior to being applied to the rigid bezel.

20. The method of claim 14, wherein the sealant coating possesses a thickness of about 0.060 inches after application on the rigid bezel.

* * * * *